(12) United States Patent
Shimada (10) Patent No.: US 8,406,059 B2
(45) Date of Patent: Mar. 26, 2013

(54) NONVOLATILE SEMICONDUCTOR MEMORY DEVICES, DATA UPDATING METHODS THEREOF, AND NONVOLATILE SEMICONDUCTOR MEMORY SYSTEMS

(75) Inventor: Toshiki Shimada, Yokohama (JP)

(73) Assignee: Samsung Electronics Co., Ltd. (KR)

( * ) Notice: Subject to any disclaimer, the term of this patent is extended or adjusted under 35 U.S.C. 154(b) by 321 days.

(21) Appl. No.: 12/945,230

(22) Filed: Nov. 12, 2010

(65) Prior Publication Data

US 2011/0161570 A1   Jun. 30, 2011

(30) Foreign Application Priority Data

Dec. 24, 2009   (JP) ................................. 2009-293400
Mar. 19, 2010   (KR) ........................ 10-2010-0024717

(51) Int. Cl.
   *G11C 16/04*   (2006.01)
(52) U.S. Cl. .......... 365/185.24; 365/185.08; 365/185.09
(58) Field of Classification Search ............. 365/185.24, 365/185.08, 185.09, 185.29, 185.3, 185.11; 711/103, E12.001, E12.008
   See application file for complete search history.

(56) References Cited

U.S. PATENT DOCUMENTS

| | | | |
|---|---|---|---|
| 7,773,445 B2 * | 8/2010 | Pagano et al. | 365/210.12 |
| 8,179,717 B2 * | 5/2012 | Shepard et al. | 365/185.02 |
| 2008/0144378 A1 * | 6/2008 | Park et al. | 365/185.05 |

FOREIGN PATENT DOCUMENTS

| | | |
|---|---|---|
| JP | 05-233478 | 9/1993 |
| JP | 09-146767 | 6/1997 |
| JP | 2002-014833 | 1/2002 |

* cited by examiner

*Primary Examiner* — Gene Auduong
(74) *Attorney, Agent, or Firm* — Myers Bigel Sibley & Sajovec, P.A.

(57) ABSTRACT

Integrated circuit memory devices utilize techniques to improve the timing of data update operations within a nonvolatile memory, by more efficiently combining memory cell programming operations with threshold voltage adjust operations on erased memory cells. These adjust operations operate to narrow a threshold voltage distribution between memory cells that remain in an erased state after the programming operation has been performed. An integrated circuit memory device may include at least a first block of non-volatile memory cells and a volatile memory device, which has a data storage capacity equivalent to at least a capacity of the at least a first block of non-volatile memory cells. A memory controller is also provided, which is electrically coupled to the at least a first block of non-volatile memory cells and the volatile memory device. The memory controller is configured to, among other things, control data update operations within a block of data stored within the first block of non-volatile memory cells.

17 Claims, 5 Drawing Sheets

(PRIOR ART)

Fig. 5

(PRIOR ART)

NONVOLATILE SEMICONDUCTOR MEMORY DEVICES, DATA UPDATING METHODS THEREOF, AND NONVOLATILE SEMICONDUCTOR MEMORY SYSTEMS

REFERENCE TO PRIORITY APPLICATION

This application claims priority to Japanese Patent Application No. 2009-293400, filed Dec. 24, 2009, and to Korean Patent Application No. 10-2010-0024717, filed Mar. 19, 2010, the contents of which are hereby incorporated herein by reference.

FIELD OF THE INVENTION

The invention relates to semiconductor memory devices and, more particularly, to nonvolatile semiconductor memory devices and nonvolatile semiconductor memory systems.

BACKGROUND

Flash memory devices are nonvolatile semiconductor memory devices capable of storing data in the absence of power. For example, a flash memory device may program an erase state (e.g., a '1' state) into a program state (e.g., a '0' state) on a 1-byte basis. The flash memory device must program new data after erasing old data on a block basis.

In a system including a typical flash memory device, a RAM is located outside the flash memory device and is connected through an external bus to the flash memory device. Thus, an operation of updating data stored in the flash memory device can require an operation of copying data from the flash memory device into the RAM, an operation of erasing the flash memory, and an operation of re-programming updated data from the RAM into the flash memory device.

Figure 3:
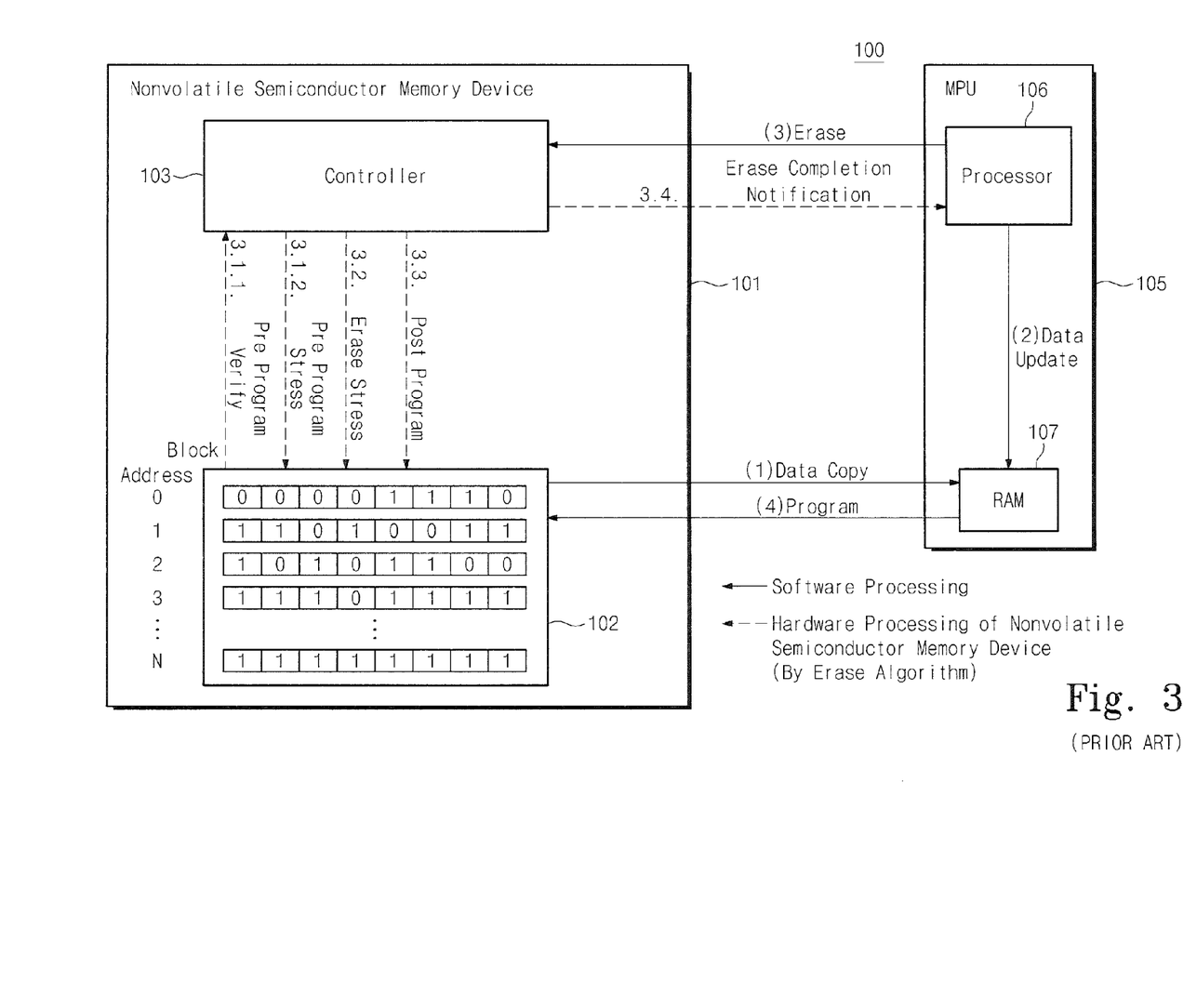
FIG. 3 is a block diagram of a conventional nonvolatile semiconductor memory system.

FIG. 3 is a block diagram of a typical nonvolatile semiconductor memory system. Referring to FIG. 3, a nonvolatile semiconductor memory system 100 includes a nonvolatile semiconductor memory device 101 and a micro processing unit (MPU) 105. The nonvolatile semiconductor memory 101 includes a memory region and a controller 103. The memory region is divided into blocks and used to store data. The data stored in the memory region are updated on a block basis. The controller 103 controls an overall operation of the nonvolatile semiconductor memory device 101. For example, the controller 103 determines whether the state of each cell in a block 102 of the memory region is in a program state (e.g., a '0' state) or in an erase state (e.g., a '1' state).

The MPU 105 is connected to the nonvolatile semiconductor memory device 101. The MPU 105 includes a processor 106 and a RAM 107. It will be readily understood that the RAM 107 is not limited to being included in the MPU 105. For example, the RAM 107 may be located outside the MPU 105 and the nonvolatile semiconductor memory device 101.

The processor 106 is connected to the controller 103 of the nonvolatile semiconductor memory device 101. The processor 106 communicates with the controller 103 to control a data updating operation. For example, the processor 106 provides an erase start command to the controller 103. In response to the erase start command, data of the block 102 including update data of the nonvolatile semiconductor memory device 101 are copied into the RAM 107. The data copied into the RAM 107 are updated in the RAM 107.

Figure 4:
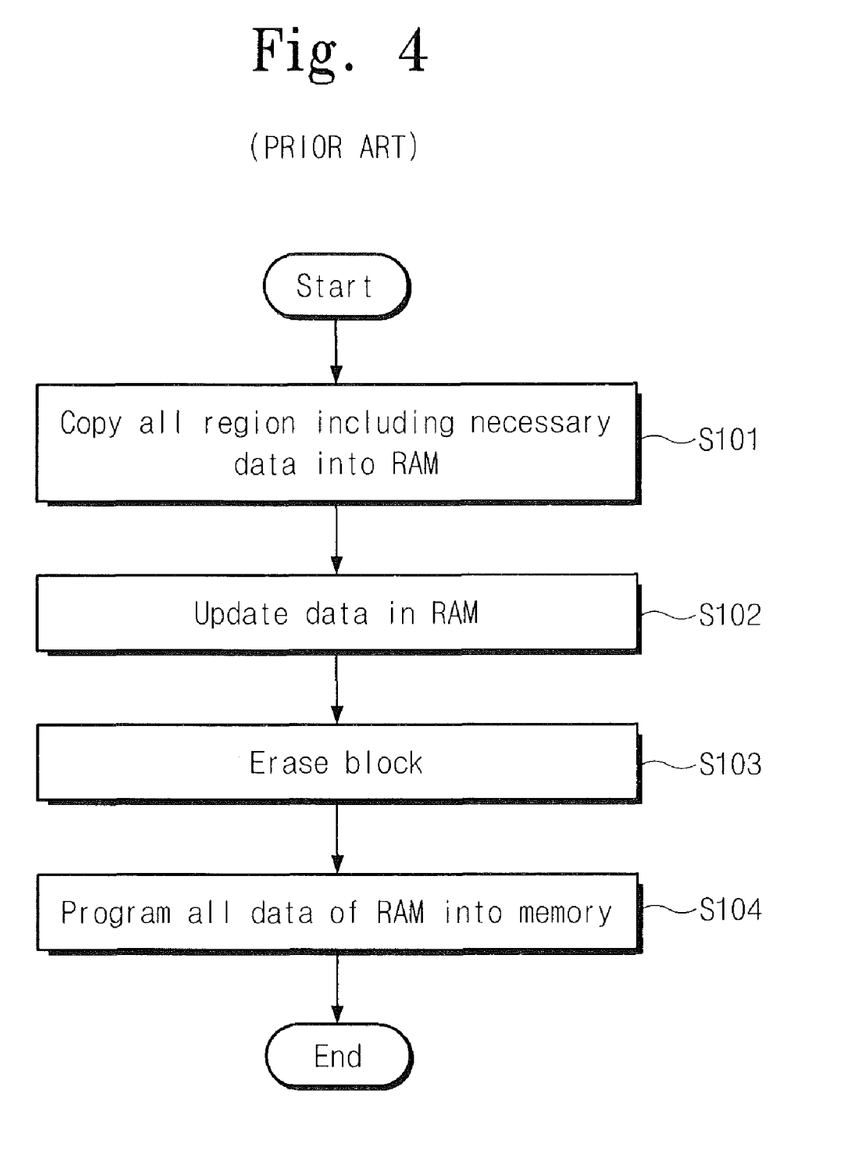
FIG. 4 is a flow chart illustrating a conventional operation of updating data stored in a nonvolatile semiconductor memory device.

FIG. 4 is a flow chart illustrating a typical operation of updating data stored in the nonvolatile semiconductor memory device 101. Referring to FIG. 4 in step S101, the processor 106 copies all the data of the block 102 in the memory region of the nonvolatile semiconductor memory device 101, which includes update data, into the RAM 107 located outside the nonvolatile semiconductor memory device 101. For example, the RAM 107 may be included in the MPU 105. In step S102, the processor 106 updates only an update data portion of the data copied into the RAM 107. In step S103, the processor 106 controls the controller 103 to erase the corresponding block 102 of the memory region of the nonvolatile semiconductor memory device 101. The processor 106 re-programs all the block data, which include the data updated in the RAM 107, into the corresponding block 102 of the memory region of the nonvolatile semiconductor memory device 101.

Figure 5:
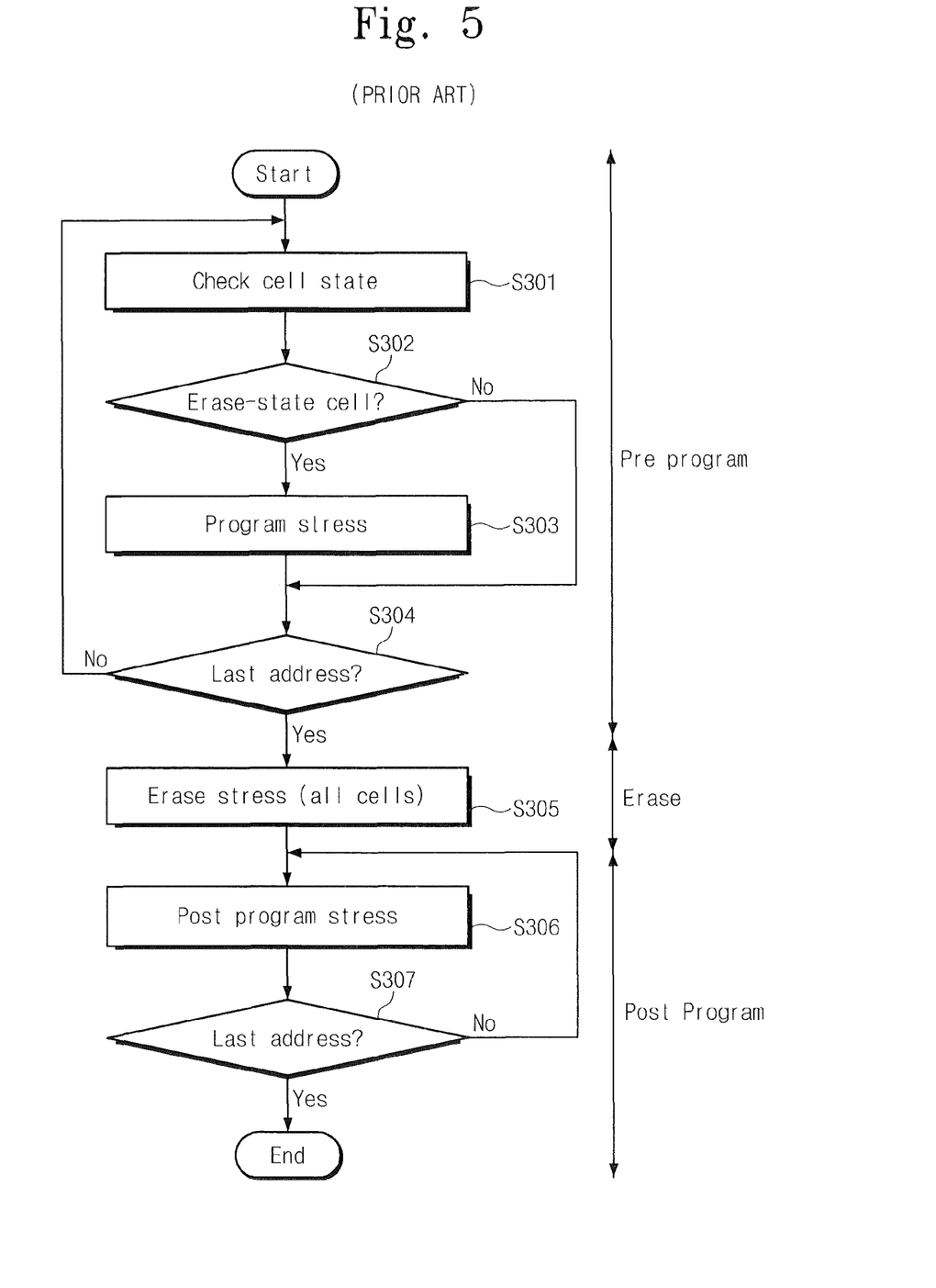
FIG. 5 is a flow chart illustrating an erase operation of step S103 illustrated in FIG. 4.

FIG. 5 is a flow chart illustrating the erase operation of step S103 illustrated in FIG. 4. Referring to FIG. 5, the erase operation includes a pre program operation, an erase operation, and a post program "threshold voltage adjust" operation. In the pre program operation, the controller 103 programs all the cells having an erase state (e.g., a '1' state) into a program state (e.g., a '0' state). In order to perform this operation, the controller 103 checks (e.g., verifies) whether the state of each cell is in a program state or an erase state, sequentially from the first address of the corresponding block 102, in step S301. Thereafter, in step S302, the erase operation proceeds according to the checked cell state. If the cell state is a program state (NO), the erase operation proceeds to step S304. If the cell state is an erase state (YES), the erase operation proceeds to step S303.

In step S303, the controller 103 applies a program stress (e.g., a program voltage) to the cell having an erase state to thereby program the corresponding cell. In step S304, the controller 103 determines whether the pre program operation is performed up to the last address in the block 102. If the pre program operation is not performed up to the last address in the block 102 (NO), the controller 103 returns to step S301 to perform a pre program operation on the next address. If the pre program operation is performed up to the last address in the block 102 (YES), the controller 103 performs an erase operation of step S305.

In step S305, the controller 103 erases all the cells of the block 102 (i.e., performs a "flash" erase) and checks (e.g., verifies) whether the erase operation is normally performed. When the erase operation is completed, a post program operation of step S306 is performed.

The post program operation is an operation that adjusts and equalizes the minimum physical voltage (e.g., threshold voltage Vth) of all the erased cells of the block 102. For example, in step S306, the controller 130 equalizes the minimum physical voltage (e.g., threshold voltage Vth) of each cell by applying a post program stress (e.g., a post program voltage) to each cell sequentially from the first address in the block 102. Then, the controller 103 checks (e.g., verifies) whether the cell is programmed to the minimum physical voltage (e.g., threshold voltage Vth).

Thereafter, in step S307, the controller 103 determines whether the post program operation (i.e., the equalization of the minimum physical voltage (e.g., threshold voltage Vth) is performed up to the last address in the block 102. If the post program operation is not performed up to the last address in the block 102 (NO), the controller 103 returns to step S306 to perform a post program operation of the next address. If the post program operation is performed up to the last address in the block 102 (YES), the controller 103 ends the post program operation. That is, the controller 103 ends the erase operation (i.e., step S130 of FIG. 4).

SUMMARY OF THE INVENTION

Integrated circuit memory devices and systems according to embodiments of the invention utilize techniques to improve the timing of data update operations within a non-volatile memory, by more efficiently combining memory cell programming operations with threshold voltage adjust operations on erased memory cells, which operate to narrow a threshold voltage distribution between memory cells that remain in an erased state after the programming operation has been performed. According to some of these embodiments of the invention, an integrated circuit memory device includes at least a first block of non-volatile memory cells and a volatile memory device, which has a data storage capacity equivalent to at least a capacity of the at least a first block of non-volatile memory cells. A memory controller is also provided, which is electrically coupled to the at least a first block of non-volatile memory cells and the volatile memory device. The memory controller is configured to, among other things, control data update operations within a block of data stored within the first block of non-volatile memory cells.

These update operations include applying program stresses to erased memory cells in the first block of non-volatile memory cells to thereby increase their threshold voltages and thereby inhibit over-erase conditions within these memory cells as repeated flash erase operations are performed. These operations to apply program stresses to erased memory cells is performed concurrently with copying the block of data from the first block of non-volatile memory cells to a volatile memory device (e.g., RAM). The entire first block of non-volatile memory cells is then erased. Thereafter, the threshold voltages of a first plurality of memory cells at a first address in the first block of memory cells, which are to remain in an erased state after the update, are adjusted. This operation to adjust the threshold voltages of erased cells, which is performed to narrow a distribution of their threshold voltages, is performed concurrently with programming a second plurality of memory cells at the first address with data read from the volatile memory device.

According to still further embodiments of the invention, the memory controller is further configured to update the block of data in the volatile memory device and the programming of the second plurality of memory cells includes programming the second plurality of memory cells with updated data read from the volatile memory device. In addition, the operations to adjust threshold voltages of a first plurality of erased memory cells at the first address may include increasing respective threshold voltages of at least some of the first plurality of erased memory cells to levels that continue to reflect an erased state within the distribution, yet narrow a threshold voltage distribution amongst the erased cells.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Preferred embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Hereinafter, exemplary embodiments of the inventive concept will be described in detail with reference to the accompanying drawings.

Figure 1:
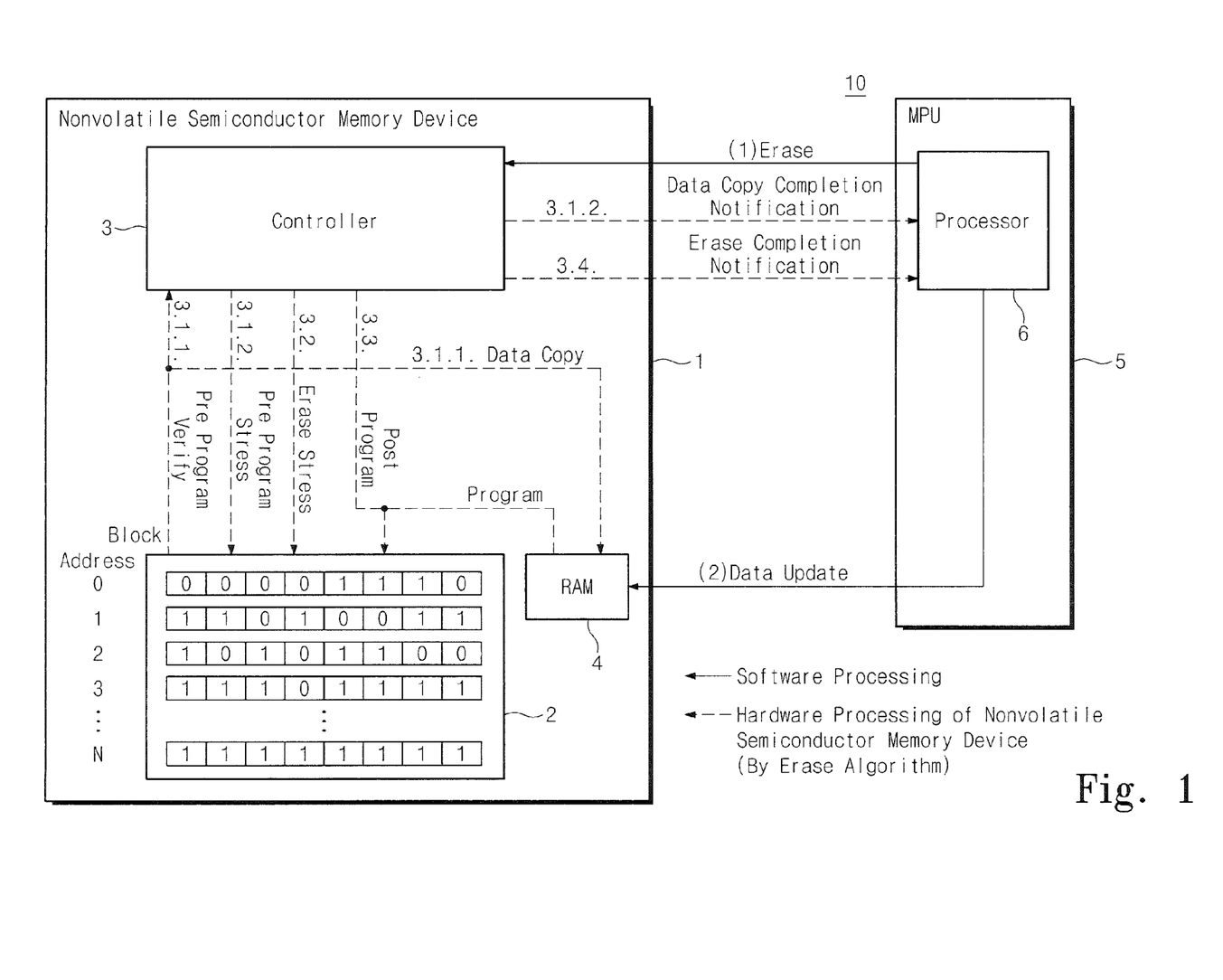
FIG. 1 is a block diagram of a nonvolatile semiconductor memory system according to an exemplary embodiment of the inventive concept.

FIG. 1 is a block diagram of a nonvolatile semiconductor memory system according to an exemplary embodiment of the inventive concept. Referring to FIG. 1, a nonvolatile semiconductor memory system 10 includes a nonvolatile semiconductor memory device 1 and a micro processing unit (MPU) 5. The nonvolatile semiconductor memory 1 includes a memory region, a controller 3, and a RAM 4. The memory region is divided into blocks and used to store data. The data stored in the memory region are updated on a block basis.

The controller 3 controls an overall operation of the non-volatile semiconductor memory device 1. For example, the controller 3 determines whether the state of each cell in a block 2 of the memory region is a program state (e.g., a '0' state) or an erase state (e.g., a '1' state). The data of the block 102 including update data are copied into the RAM 4. The data copied into the RAM 4 are updated in the RAM 4.

Although not illustrated in FIG. 1, the nonvolatile semiconductor memory device 1 may include a regulator that generates a program voltage for programming a cell and a post program voltage for equalizing the minimum physical voltage (e.g., threshold voltage Vth) causing a response of each cell after erasing the cell. Also, the nonvolatile semiconductor memory device 1 may include a voltage conversion switch for converting a voltage applied to a cell.

The MPU 5 is connected to the nonvolatile semiconductor memory device 1. The MPU 5 includes a processor 6. The processor 6 is connected to the controller 3 of the nonvolatile semiconductor memory device 1. The processor 6 communicates with the controller 3 to control a data updating operation. For example, the processor 6 provides an update operation start command to the controller 3. Also, the processor 6 provides data update information (information indicating which bit value of data is to be updated to a certain value) to the RAM 4 of the nonvolatile semiconductor memory device 1.

Figure 2:
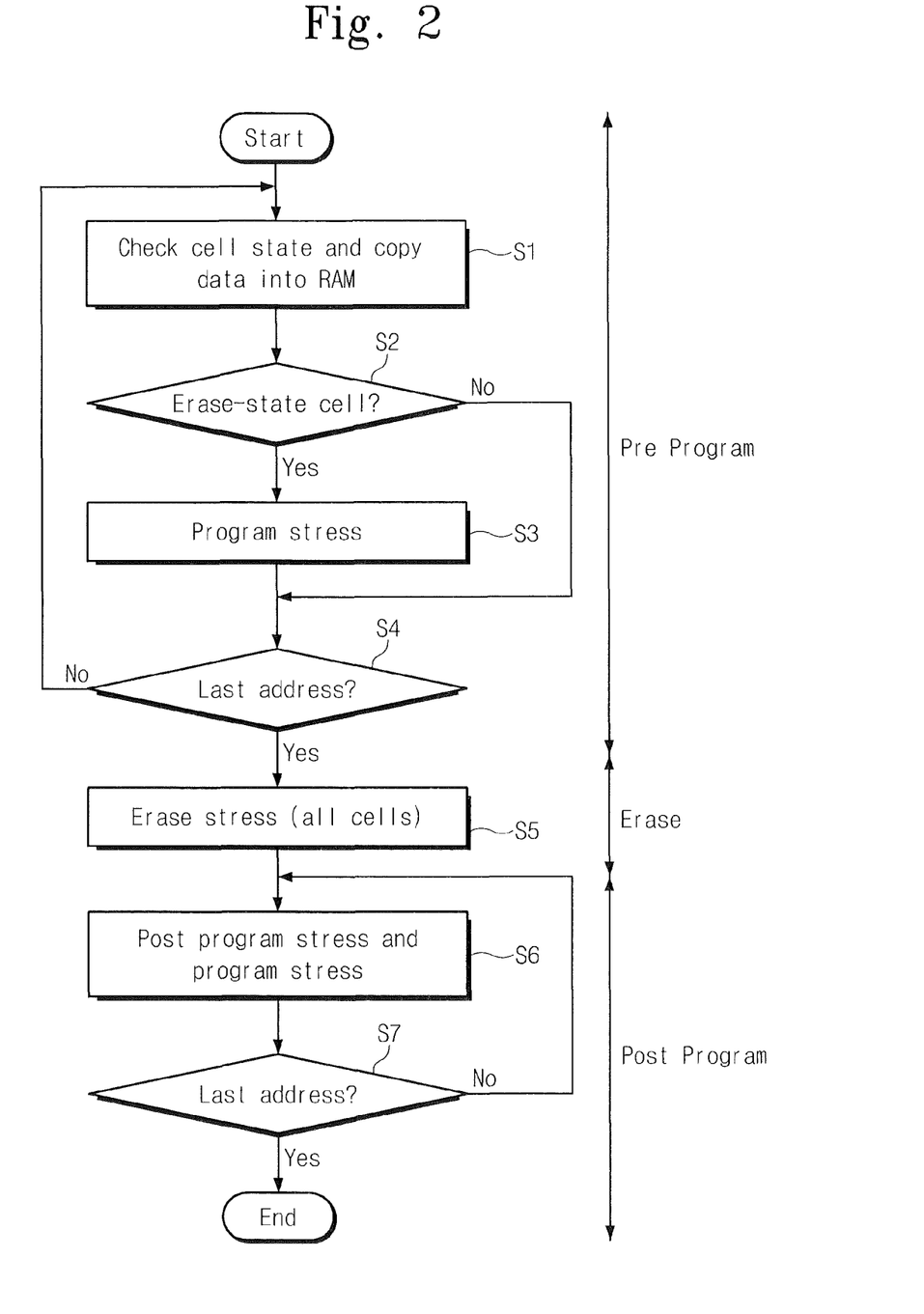
FIG. 2 is a flow chart illustrating an operation of updating data stored in a nonvolatile semiconductor memory system of FIG. 1, according to an exemplary embodiment of the inventive concept.

FIG. 2 is a flow chart illustrating an operation of updating data stored in a nonvolatile semiconductor memory device according to an exemplary embodiment of the inventive concept. Referring to FIG. 2, the data updating operation includes a pre program operation, an erase operation, and a post program operation.

In the pre program operation, the controller 3 copies all the data of the block 2 including update data into the RAM 4. Concurrently, the controller 3 programs all the cells of an erase state. In order to perform this operation, the controller 3 determines (e.g., verifies) whether the state of each cell is a program state or an erase state, sequentially from the first address of the block 2, in step S1. Concurrently, the controller 3 copies data, stored in the block 2, into the RAM 4 with reference to the determined cell state.

In step S2, the data updating operation proceeds according to the determined cell state. If the cell state is a program state (NO), the data updating operation proceeds to step S4. If the cell state is an erase state (YES), the data updating operation proceeds to step S3. In step S3, the controller 3 applies a program stress (e.g., a program voltage) to the cell of an erase state to program the corresponding cell. In step S4, the controller 3 determines whether the pre program operation is performed up to the last address in the block 2. If the pre program operation is not performed up to the last address in the block 2 (NO), the controller 3 returns to step S1 to perform a pre program operation of the next address. If the pre program operation is performed up to the last address in the block 2 (YES), the controller 3 performs an erase operation of step S5.

In step S5, the controller 3 erases all the cells of the block 2 and checks (e.g., verifies) whether the erase operation is normally performed. Concurrently, the controller 3 updates the data copied into the RAM 4. When the erase operation is completed, a post program operation of step S6 is performed.

In the post program operation, the controller 3 equalizes the minimum physical voltage (e.g., threshold voltage Vth) causing a response of the cell of an erase state. Concurrently, the controller 3 programs data by applying a program voltage to a cell that is to be programmed due to data update. Herein, a post program voltage for equalizing the minimum physical voltage (e.g., threshold voltage Vth) causing the response after the erase operation is different from a program voltage for programming a cell. These voltages may be generated by a regulator (not illustrated). Also, the voltage applied to the cell may be changed by a voltage conversion switch according to the cell state of the updated data.

In step S6, the controller 3 performs a program operation by applying a stress (e.g., a program voltage) to each cell from the first address of the block 2. The controller 3 refers to the updated data stored in the RAM 4 when applying a stress (e.g., a program voltage). That is, if the updated data are data corresponding to an erase state, the controller 3 applies a stress (e.g., a post program voltage) for equalizing the minimum physical voltage (e.g., threshold voltage Vth) causing a response, to the cell. Also, the controller 3 checks (e.g., verifies) whether the cell is programmed by the minimum physical voltage (e.g., threshold voltage Vth) causing the normal response. On the other hand, if the updated data are data corresponding to a program state, the controller 3 applies a stress (e.g., a program voltage) for a program operation to the cell.

In step S7, the controller 3 determines whether the post program operation (i.e., the application of the post program voltage or the program voltage) is performed up to the last address in the block 2. If the post program operation is not performed up to the last address in the block 2 (NO), the controller 3 returns to step S6 to perform a post program operation of the next address. If the post program operation is performed up to the last address in the block 2 (YES), the controller 3 ends the post program operation and ends the data updating operation.

According to an exemplary embodiment of the inventive concept, the data of the block including update data are copied into the RAM during the operation of determining (e.g., verifying) the cell state in the pre program operation. Also, the data updated in the RAM are re-programmed into the corresponding block during the operation of applying a post program stress (e.g., a post program voltage). Accordingly, the time taken to update data is reduced. That is, the typical data updating operation includes an operation of copying data in a block, an operation of erasing the block, and an operation of programming the updated data into the block. The data updating operation according to an exemplary embodiment of the inventive concept includes only an erase operation. Also, since the RAM is included in the nonvolatile semiconductor memory device, the command occurrence count between the nonvolatile semiconductor memory device and the MPU can be reduced.

It is assumed that each block includes 512 words. Also, it is assumed that the time taken to copy data of the block into the RAM is 65 ns per word, the time taken to generate a command is 65 ns per word, and the time taken for a program operation of the nonvolatile semiconductor memory device is 500 ns per word. When a data updating operation is performed according to the embodiments of the inventive concept, a copy operation time (65 ns×512 words=33 μs), a command generation time (65 ns×512 words=33 μs) and a program operation time (500 ns×512 words=256 μs) are saved. That is, a total of 322 μs per 512 words is saved. If each block is 32 kilowords, a data updating time of about 20 ms (=322 μs×(32 KW/512 W)) is saved.

As described above, the use of the embodiments of the inventive concept reduces the external processing time in updating data of a nonvolatile semiconductor memory device, thus reducing the data updating time of the nonvolatile semiconductor memory device. Accordingly, it is possible to improve the performance of nonvolatile semiconductor memory systems using embodiments of the invention. As illustrated by FIGS. 1-2, some of these embodiments include integrated circuit memory devices 1 that are configured to improve the timing of data update operations within a non-volatile memory 2, by more efficiently combining memory cell programming operations with threshold voltage adjust operations on erased memory cells. These adjust operations operate to narrow a threshold voltage distribution between memory cells that remain in an erased state after the programming operation has been performed. As illustrated by FIG. 1, an integrated circuit memory device 1 includes at least a first block of non-volatile memory cells 2 and a volatile memory device (e.g., RAM 4), which has a data storage capacity equivalent to at least a capacity of the at least a first block of non-volatile memory cells 2. A memory controller 3 is also provided, which is electrically coupled to the at least a first block of non-volatile memory cells 2 and the volatile memory device 4. The memory controller 3 is configured to, among other things, control data update operations within a block of data stored within the first block of non-volatile memory cells 2.

These update operations include applying program stresses to erased memory cells in the first block of non-volatile memory cells 2 to thereby increase their threshold voltages and thereby inhibit over-erase conditions within these memory cells as repeated flash erase operations are performed. These operations to apply program stresses to erased memory cells is performed concurrently with copying the block of data from the first block of non-volatile memory cells 2 to a volatile memory device 4. The entire first block of non-volatile memory cells 2 is then erased. Thereafter, the threshold voltages of a first plurality of memory cells at a first address (e.g., Address 0-N) in the first block of memory cells 2, which are to remain in an erased state after the update, are adjusted. This operation to adjust the threshold voltages of erased cells, which is performed to narrow a distribution of their threshold voltages, is performed concurrently with programming a second plurality of memory cells at the first address with data read from the volatile memory device 4.

According to still further embodiments of the invention, the memory controller 3 is further configured to update the block of data in the volatile memory device 4 and the programming of the second plurality of memory cells includes programming the second plurality of memory cells with updated data read from the volatile memory device 4. In addition, the operations to adjust threshold voltages of a first plurality of erased memory cells at the first address may include increasing respective threshold voltages of at least some of the first plurality of erased memory cells to levels that continue to reflect an erased state within the distribution, yet narrow a threshold voltage distribution amongst the erased cells.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An integrated circuit memory device, comprising:
   at least a first block of non-volatile memory cells;
   a volatile memory device having a data storage capacity equivalent to at least a capacity of said at least a first block of non-volatile memory cells; and
   a memory controller electrically coupled to said at least a first block of non-volatile memory cells and said volatile memory device, said memory controller configured to update a block of data in the first block of non-volatile memory cells by:
   applying program stresses to erased memory cells in the first block of non-volatile memory cells to thereby increase their threshold voltages concurrently with copying the block of data from the first block of non-volatile memory cells to said volatile memory device; then
   erasing the entire first block of non-volatile memory cells; and then
   adjusting threshold voltages of a first plurality of erased memory cells at a first address in the first block of memory cells to thereby narrow a distribution of threshold voltages between the first plurality of erased memory cells concurrently with programming a second plurality of memory cells at the first address with data read from said volatile memory device.

2. The memory device of claim 1, wherein said memory controller is further configured to update the block of data in said volatile memory device; and wherein programming the second plurality of memory cells comprises programming the second plurality of memory cells with updated data read from said volatile memory device.

3. The memory device of claim 1, wherein said adjusting threshold voltages of a first plurality of erased memory cells at the first address comprises increasing respective threshold voltages of at least some of the first plurality of erased memory cells to levels that continue to reflect an erased state within the distribution.

4. The memory device of claim 1, wherein the volatile memory device is a random access memory (RAM).

5. The memory device of claim 1, wherein said memory controller is further configured to adjust threshold voltages of a third plurality of erased memory cells at a second address in the first block of memory cells concurrently with programming a fourth plurality of memory cells at the second address with data read from said volatile memory device.

6. A nonvolatile semiconductor memory device comprising:
   a memory region configured to store data;
   a random-access memory (RAM) configured to copy the data stored in the memory region; and
   a controller configured to control the memory region and the RAM,
   wherein the controller performs a data updating operation including a pre program operation, an erase operation and a post program operation,
   wherein the controller is configured to copy the data of the memory region into the RAM during the pre program operation, update the data copied into the RAM during the erase operation, and program the data updated in the RAM into the memory region during the post program operation.

7. The nonvolatile semiconductor memory device of claim 6, wherein during the pre program operation, the cell state of the region including update data among the data of the memory region is determined and the cell of an erase state is programmed according to the determination result.

8. The nonvolatile semiconductor memory device of claim 7, Wherein the cell state of the region including the update data is determined to be one of a program state and an erase state.

9. The nonvolatile semiconductor memory device of claim 7, wherein the operation of determining the cell state of the region including the update data and the operation of copying data of the region including the update data into the RAM are simultaneously performed during the pre program operation.

10. The nonvolatile semiconductor memory device of claim 6, wherein all the cells of the region including update data among the data of the memory region are erased during the erase operation.

11. The nonvolatile semiconductor memory device of claim 6, wherein the threshold voltage of the cell erased during the erase operation is equalized during the post program operation.

12. The nonvolatile semiconductor memory device of claim 11, wherein during the post program operation, a post program voltage is applied to the cell corresponding to an erase state according to the data updated in the RAM, and a program voltage is applied to the cell corresponding to a program state.

13. The nonvolatile semiconductor memory device of claim 12, wherein the post program voltage is to equalize the threshold voltage of the erased cell.

14. The nonvolatile semiconductor memory device of claim 12, wherein the program voltage is to program the erased cell.

15. The nonvolatile semiconductor memory device of claim 6, wherein the RAM temporarily stores data of the update region among the data of the memory region.

16. A nonvolatile semiconductor memory system comprising:
    a nonvolatile semiconductor memory device; and
    a micro processing unit (MPU) configured to control the nonvolatile semiconductor memory device,
    the nonvolatile semiconductor memory device comprising:
    a memory region configured to store data;
    a random-access memory (RAM) configured to copy the data stored in the memory region; and
    a controller configured to control the memory region and the RAM, wherein the controller performs a data updating operation including a pre program operation, an erase operation and a post program operation, wherein the controller is configured to copy the data of the memory region into the RAM during the pre program operation, update the data copied into the RAM during the erase operation, and program the data updated in the RAM into the memory region during the post program operation.

17. A data updating method of a nonvolatile semiconductor memory device including a memory region configured to store data, a random-access memory (RAM) configured to copy the data stored in the memory region, and a controller configured to control the memory region and the RAM, the data updating method comprising:

a pre program operation of determining the cell state of the region including update data among the data of the memory region, and programming the cell of an erase state according to the determination result;

an erase operation of erasing all the cells of the region including the update data among the data of the memory region; and a post program operation of equalizing the threshold voltage of the cell erased during the erase operation, wherein the data of the memory region are copied into the RAM during the pre program operation, the data copied into the RAM are updated during the erase operation, and the data updated in the RAM are programmed into the memory region during the post program operation.

* * * * *